METHOD OF JOINING A SEMICONDUCTOR TO A CONDUCTOR

Filed March 30, 1955

INVENTOR
ANTHONY J. MARINO, JR.
BY Henry Kolin
AGENT

United States Patent Office 3,065,534

Patented Nov. 27, 1962

3,065,534

METHOD OF JOINING A SEMICONDUCTOR TO A CONDUCTOR

Anthony J. Marino, Jr., North Bergen, N.J., assignor to International Telephone and Telegraph Corporation, Nutley, N.J., a corporation of Maryland Filed Mar. 30, 1955, Ser. No. 497,879
2 Claims. (Cl. 29—473.1)

This invention relates to semiconductor devices and more particularly to a method for mounting germanium and silicon semiconductor bodies.

In the manufacture of electrical translators using semiconductor bodies, one of the problems encountered is the mounting of the semiconductor body to a metallic base member in a simple manner to yield a permanent bond without degrading the properties of the semiconductor. Where selenium is the semiconductor body, the selenium is usually dusted, in the form of a fine powder, upon a metallic base, and the unit is then subjected to heat and pressure. Where germanium and silicon are the semiconductors employed, one practice has been to mount the semiconductor bodies by freezing soft metal about them. In more recent practice, semiconductor bodies have been secured to conductive bases and wire members by soldering techniques. A typical method for mounting a germanium semiconductor body is described in U.S. Patent 2,662,997. In the described method, a germanium wafer is soldered to a brass base using zinc-ammonium chloride as a fluxing agent. In U.S. Patent 2,402,661, a silicon semiconductor body is rhodium plated and then tinned with a conventional lead-tin solder using an acidified zinc chloride flux.

In all the foregoing methods where soldering techniques are used to attach semiconductor bodies such as germanium and silicon to an electrode, such as a metallic base or wire member, the use of a flux has been found essential. Attempts to attach the semiconductor body to the conductor electrode in an ohmic, i.e., non-rectifying, manner without using a flux have proven unsuccessful. It is believed that the hot surface of the semiconductor and of the solder tend to become oxidized, and these oxides, unless scavenged by a flux, interfere with obtaining a satisfactory bond between the semiconductor and the electrode. Thus, the practice has been, following the fluxing and soldering operation, to boil the semiconductor body in distilled water for approximately an hour in order to remove the contaminants introduced by the use of the flux. Such decontamination techniques are very time consuming, and often the water-boiling technique is insufficient to clean the devices completely and other chemical reagents must be used therefor. For, if traces of the contaminating flux are permitted to remain, the electrical parameters of the semiconductor unit are adversely affected thereby and as a consequence the contaminated semiconductor unit is rejected.

It is an object of this invention to provide a method for joining a semiconductor body to a conductor electrode which is adaptable to the large-scale production of semiconductor devices. It is a further object to provide such a method that is non-contaminating to germanium and silicon semiconductors.

It is a feature of this invention that a semiconductor body is joined to a conductor electrode by the use of a metallic solder and in the absence of any fluxing agent. It is a more specific feature of this invention that this soldering operation is performed in a non-oxidizing atmosphere, preferably a reducing atmosphere.

Other objects and features of this invention will be apparent from the following figures taken in conjunction with the description thereof in which.

Figure 1:
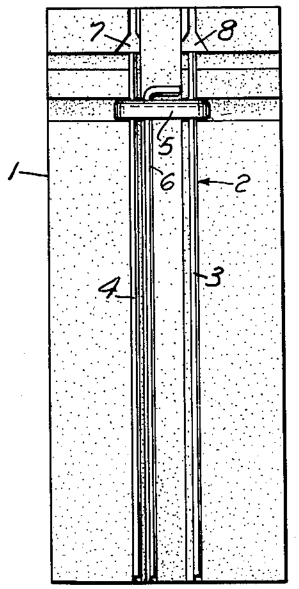
FIG. 1 is an elevational view of a jig for the assembly of a junction transistor in accordance with the principles of this invention.

Referring to FIG. 1, jig 1 is provided for receiving a junction transistor element 2. This jig may be in the form of a carbon block having grooves therein. The electrodes 3 and 4 which make a low-resistance ohmic contact with the semiconductor body are located at opposite ends of the supporting base 5. The non-ohmic contact 6 is shown located between the end electrodes 3 and 4. Grooves 7 and 8 are provided in which the semiconductor crystal may be placed touching the electrode members 3 and 4 under a slight tension. Substantially any suitable material such as carbon, ceramic, stainless steel or quartz may be used for the jig provided the material is non-reactive with the semiconductor body, electrodes or solder at the temperatures employed.

Figure 2:
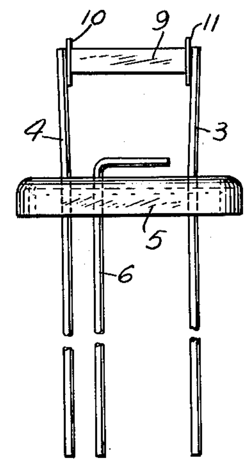
FIG. 2 is an elevational view of a junction transistor showing the semiconductor body in position prior to the soldering operation.

Referring to FIG. 2, the semiconductor body 9, such as a crystal of germanium or silicon, is shown placed between the ohmic conductor contacts 3 and 4 with sections of metallic foil 10 and 11 disposed between ends of the semiconductor body and the ohmic electrode members. The semiconductor unit contained in the jig is placed in a furnace in which a non-oxidizing atmosphere is maintained. The temperature of the furnace is gradually increased while maintaining this non-oxidizing atmosphere until the melting point of the solder foils 10 and 11 has been exceeded. The solder then flows and alloys with both electrodes 3 and 4 and the semiconductor crystal 9. The temperature of the furnace is then lowered, while still maintaining a non-oxidizing atmosphere, until the solder has frozen.

Figure 3:
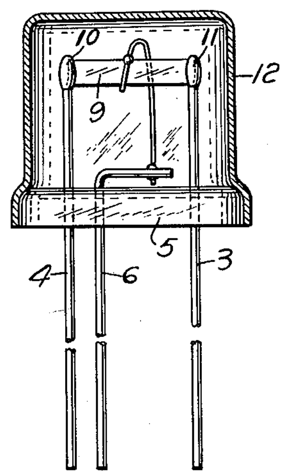
FIG. 3 is an elevational view partly in section of an assembled junction transistor made in accordance with the principles of this invention.
Figure 4:
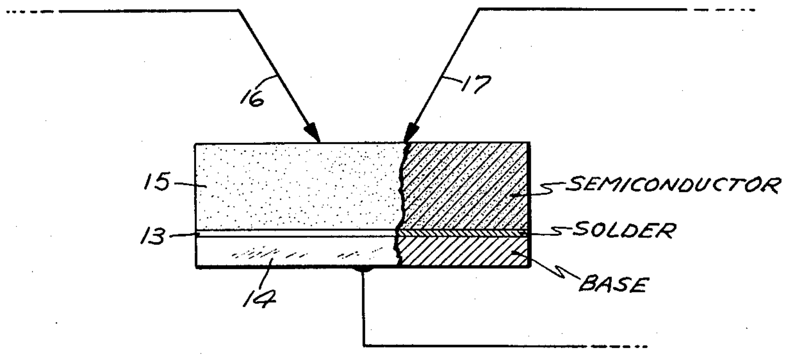
FIG. 4 is an elevational view partly in section of a semiconductor device in which a semiconductor body is joined to a conductor base in accordance with this invention.

As may be seen in FIG. 3, the solder 10 and 11 has flowed about the ohmic conductor contacts 3 and 4 and the semiconductor crystal 9 forming a firm bond therebetween. The completed semiconductor device is shown in FIG. 3 with the non-ohmic electrode 6 bonded to the crystal 9 and with an encapsulating container 12 about the entire unit.

Where it is desired to attach a semiconductor body to a metallic base member over a broad area, substantially the same technique as described above may be used. Such a technique is extremely useful in forming junction diodes, point-contact diodes and point-contact transistors as well as other similar devices. As shown in FIG. 4, a layer of solder 13 is provided between the conductive base member 14 and the semiconductor body 15, with non-ohmic point-contact electrodes 16 and 17 in contact with the semiconductor body, as might be used for a point-contact transistor, for example. A preferred method for joining the semiconductor body 15 to the conductive base member 14 would consist of placing a foil of pure tin of a predetermined size and shape between the base member and the semiconductor body, placing the entire semiconductor unit in a furnace in which a non-oxidizing atmosphere is provided, and elevating the temperature above the melting point of the solder 13. After the solder has flowed, the temperature is lowered while still maintaining the non-oxidizing atmosphere, until freezing of the solder has occurred.

It is readily seen that the foregoing techniques, offered by way of description only and not as a limitation to the scope of this invention, are readily adapted to the mass production of semiconductor devices. Thus, comparatively little time and material is required in cleaning the semiconductor bodies of these devices prior to their completed assembly, and the extremely troublesome step of removing traces of the fluxing agent has been eliminated. As a consequence, the high rate of rejection of semiconductor devices because of flux contamination is reduced to zero. It is, of course, readily apparent that many modifications may be made in the practice of this invention without departing from the basic principles thereof, which consist of joining a semiconductor body to a conductive electrode by means of solder in the absence of any fluxing agent and while maintaining a non-oxidizing atmosphere thereabout. A suitable non-oxidizing atmosphere may consist of any gaseous atmosphere which does not react with the semiconductor body or the metallic solder used. Atmospheres such as helium, neon, argon and nitrogen are suitable in this regard. I find that use of a reducing atmosphere such as hydrogen gas is particularly desirable in the practice of this invention inasmuch as hydrogen tends to scavenge the semiconductor surface, eliminating any oxides which may be present adventitiously as well as preventing further oxide formation.

The commonly employed solder alloys are suitable in the practice of this invention. Thus while a lead-antimony solder may be used, the ordinary soft solder of commerce, commercially referred to as a 60/40 solder, or a 63/37 solder, namely one consisting of approximately 60 parts tin and 40 parts lead, or 63 parts tin and 37 parts lead, respectively, may also be used. Alloys of this range of compositions approximate the eutectic composition for the tin-lead system. Similarly, a pure tin solder is also considered desirable. I have found, for example, that when a pure tin solder or a tin-rich solder is used in the practice of this invention, an automatic soldering process may be obtained by maintaining the temperature of the furnace at approximately 30–50° C. above the melting point of the tin. Thus where a germanium semiconductor body is used, as the tin alloys with the germanium, a germanium-enriched tin is formed which has a melting point above the melting point of the pure tin. Consequently, by maintaining the furnace at a temperature above the melting point of the tin but below the melting point of the germanium-enriched tin alloy, an automatic soldering process is provided. Thus, the tin solder melts, wets the germanium body, becomes germanium enriched, and thereby freezes. With this method, the furnace need not be cooled prior to removing the semiconuctor devices and thus a rapid automatic method for joining semiconductor bodies of germanium to the conductor has been provided.

In lieu of using a solid solder, the solder may be applied in the form of a paste. Thus a paste may be prepared by mixing a lead-tin alloy in the form of a powder with a suitable binding agent, such as glycerin and a wetting agent. Also useful in place of a soft solder is metallic gold, in the form of a foil or a paste. Glycerin and a wetting agent are suitable for preparing a gold paste. Where gold is used as the solder, the gold diffuses into the germanium or plated silicon producing a semiconductor-gold alloy. The semiconductor-enriched gold alloy has a melting point below that of pure gold, and therefore will freeze automatically, according to the germanium-gold or silicon-gold phase system, after first passing through the eutectic stage. Thus, where the semiconductor body is germanium, if the furnace is maintained at approximately 400° C., upon the gold becoming germanium enriched the eutectic alloy will be formed. This alloy melts at approximately 356° C. and hence the alloy will be in the molten or plastic state. Upon becoming further germanium enriched, the alloy will freeze at the temperature of the furnace.

Where the semiconductor body is silicon, it is considered preferable to first rhodium plate and then tin plate the surface to be soldered prior to the mounting and firing of the unit. It has been found best to use gold-plated conductor mounts for the ohmic contacts. Where mounts other than gold or gold-plated ones are used, such as a nickel-cobalt-iron alloy commercially available as Kovar, pre-tinning of the conductor electrode is preferable. Where a tin solder is used in conjunction with gold electrodes, in addition to a semiconductor-rich tin alloy being formed, a gold-rich tin alloy is produced by diffusion at temperatures of about 450° C., thereby rigidly soldering the parts into the mounts. Again, by maintaining the temperature of the furnace intermediate the melting points of tin and gold-enriched tin, an automatic soldering process is produced.

For the purposes of this invention, where reference is made to a solder consisting principally of tin, this is considered to embrace the use of pure tin as well as binary, ternary and higher alloys of tin wherein tin is the predominating element. Similar considerations apply where reference is made to a solder consisting principally of gold.

While I have described above the principles of my invention in connection with specific method steps it is to be clearly understood that this description is made by way of example only and not as a limitation to the scope of my invention as set forth in the objects thereof and in the accompanying claims.

I claim:

1. A method of joining a semiconductor to a conductor to establish a rigid low-resistance contact therebetween comprising the steps of disposing a bonding metal between a semiconductor body and a conductor thereby forming an assembly, surrounding said assembly with non-oxidizing atmosphere, heating said assembly in said atmosphere to a selected temperature, said temperature being below the melting point of the bonding metal and above the melting point of the eutectic alloy formed, and, maintaining the assembly at said selected temperature whereby an alloy is formed with said bonding metal and at least said semiconductor body, said semiconductor body being rhodium-plated silicon, said bonding metal being gold.

2. A method of joining a semiconductor to a conductor to establish a rigid low-resistance contact therebetween comprising the steps of disposing a bonding metal between a semiconductor body and a gold conductor thereby forming an assembly, surrounding said assembly with non-oxidizing atmosphere, heating said assembly in said atmosphere to a selected temperature, said temperature being below the melting point of the bonding metal and above the melting point of the eutectic alloy formed, and maintaining the assembly at said selected temperature whereby an alloy is formed with said bonding metal and at least said semiconductor body, said semiconductor body being rhodium-plated silicon, said bonding metal being gold.

References Cited in the file of this patent

UNITED STATES PATENTS

| | | |
|---|---|---|
| 2,098,411 | Wrighton | Nov. 9, 1937 |
| 2,373,117 | Hobrock | Apr. 10, 1945 |
| 2,402,661 | Ohl | June 25, 1946 |
| 2,426,467 | Nelson | Aug. 26, 1947 |
| 2,555,001 | Ohl | May 29, 1951 |
| 2,627,110 | Hickey | Feb. 3, 1953 |
| 2,633,633 | Bogart et al. | Apr. 7, 1953 |
| 2,662,997 | Christensen | Dec. 15, 1953 |
| 2,664,528 | Stelmak | Dec. 29, 1953 |
| 2,671,958 | Block | Mar. 16, 1954 |
| 2,701,326 | Pfann et al. | Feb. 1, 1955 |
| 2,719,797 | Rosenblatt | Oct. 4, 1955 |
| 2,733,359 | Brown | Jan. 31, 1956 |
| 2,757,324 | Pearson | July 31, 1956 |
| 2,761,197 | Harbaugh | Sept. 4, 1956 |
| 2,796,562 | Ellis et al. | June 18, 1957 |
| 2,857,663 | Beggs | Oct. 28, 1958 |
| 2,867,899 | Jacobs | Jan. 13, 1959 |
| 2,906,008 | Boegehold et al. | Sept. 29, 1959 |
| 2,928,162 | Marinace | Mar. 15, 1960 |

FOREIGN PATENTS

| | | |
|---|---|---|
| 625,195 | Great Britain | June 23, 1949 |